(12) United States Patent
Yang

(10) Patent No.: US 7,468,544 B2
(45) Date of Patent: Dec. 23, 2008

(54) STRUCTURE AND PROCESS FOR WL-CSP WITH METAL COVER

(75) Inventor: Wen-Kun Yang, Hsin-Chu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 26 days.

(21) Appl. No.: 11/567,795

(22) Filed: Dec. 7, 2006

(65) Prior Publication Data

US 2008/0136026 A1 Jun. 12, 2008

(51) Int. Cl.
*H01L 23/544* (2006.01)
*H01L 23/48* (2006.01)

(52) U.S. Cl. ............ 257/620; 257/773; 257/786; 257/E21.599

(58) Field of Classification Search ............ 257/620, 257/773, 786, E21.599
See application file for complete search history.

(56) References Cited

U.S. PATENT DOCUMENTS

| | | | | |
|---|---|---|---|---|
| 5,925,931 A * | 7/1999 | Yamamoto | ................ | 257/737 |
| 6,184,573 B1 * | 2/2001 | Pu | ................ | 257/666 |
| 6,607,941 B2 * | 8/2003 | Prabhu et al. | ................ | 438/113 |
| 7,101,735 B2 * | 9/2006 | Noma et al. | ................ | 438/114 |
| 7,256,073 B2 * | 8/2007 | Noma et al. | ................ | 438/110 |
| 2004/0232517 A1 * | 11/2004 | Furuhata | ................ | 257/520 |

* cited by examiner

*Primary Examiner*—Nitin Parekh
(74) *Attorney, Agent, or Firm*—Kusner & Jaffe

(57) ABSTRACT

A wafer level package comprises a wafer having a plurality of dice formed thereon; a thinner metal cover with a cavity formed therein attached on the wafer by an adhesive material to improve thermal conductivity of the package. A protection film is formed on back side of the metal cover and filled into the cavity, thereby facilitating for laser marking and obtaining a better sawing quality of the package.

19 Claims, 2 Drawing Sheets

STRUCTURE AND PROCESS FOR WL-CSP WITH METAL COVER

FIELD OF THE INVENTION

The present invention relates to a semiconductor package, and more specifically, to a wafer level package with a metal cover and protective film formed on the back side of silicon wafer therein to improve thermal conductivity and sawing quality of the package, thereby improving packaging performance and life cycle during reliability testing.

BACKGROUND OF INVENTION

Description of the Prior Art

In recent years, since the circuit devices in a chip are manufactured with a high density and it has been a trend to make semiconductor devices having small size. IC (integrated circuits) designers are tempted to scale down the size of each device and increase chip integration in per unit area. Typically, the semiconductor devices require protection from moisture and mechanical damage. The structure involves the technology of package. In the technology, the semiconductor dies or chips are usually individually packaged in a plastic or ceramic package. The package is required to protect the die and spread the heat generated by the devices. Therefore, the heat dissipation is very important in the semiconductor devices, particularly the power and the performance of the device increase.

Moreover, the conventional package is also used for performing full functionality testing of the chip. It is important that each device is kept as small as possible. Recently, there has existed a high interest of developing a package with a larger number of input and output. One of the solutions is to develop devices with ball grid array (BGA) and assembly technology. It is because that the renewed desire in high density hybrid is driven by the requirement of larger numbers of electrical connections, the increasing clock rate of digital systems.

No matter what type of packaging, most of the packaging is divided into individual chips before they are packaged. However, the packaging at the wafer level is a trend in semiconductor packaging. Typically, the wafer level package utilizes the whole wafer as an object, not utilizing a single chip or die. Hence, before performing a scribing process, packaging and testing must be accomplished. This is an advanced technique so that the process of wire bonding, mold, die mount and assembly can be omitted so do lead frame and substrate. Therefore, the cost and manufacturing time will be reduced. On the other hand, the process in traditional packaging includes, die sawing, die mounting, wire bonding, molding, trimming, marking, plating and inspection etc.

The earlier lead frame package technology is already not suitable for the advanced semiconductor dice due to the density of the terminals thereof is too high. Hence, a new package technology of BGA (Ball Grid Array) has been developed to satisfy the packaging requirement for the advanced semiconductor dice. The BGA package has an advantage of that the spherical terminals has a shorter pitch than that of the lead frame package, and the terminals of the BGA are unlikely to be damage and deform. In addition, the shorter signal transmitting distance benefits to raise the operating frequency to conform to the requirement of faster efficiency. Most of the package technologies divide dice on a wafer into respective dice and then to package and test the die respectively. Another package technology, called "Wafer Level Package (WLP)", can package the dice on a wafer before dividing the dice into respective individual die. The WLP technology has some advantages, such as a shorter producing cycle time, lower cost, and no need to under-fill or molding.

Therefore, the present provides a wafer level package to improve yield and reliability of the dice of wafer level package.

SUMMARY OF THE INVENTION

In view of the drawbacks of prior art, the present invention provides a package structure with a protective film to protect the silicon chip without damage, and improve the packaging performance and life cycle during reliability testing.

An object of the present invention is to provide a package with a better thermal conductivity and mechanical protection by using metal which preferred material is alloy 42 (Ni 42% and Fe 58%) to act as a cover layer of the package due to the CTE (coefficient of thermal expansion) close to silicon wafer.

A further object of the present invention is to provide a package with a thinner package possible of manufacture and the purpose of the present invention is to disclose the wafer level package and the process of the same.

A yet object of the present invention is to make the package that is adapted to the wafer level burn-in test and the final test.

The present invention includes a wafer level package which is comprises a wafer having a plurality of dice formed thereon, wherein the wafer has a trench formed therein; a dielectric layer formed over the plurality of dice and refilled into the trench to expose pads of the plurality of dice; a metal layer attached on the wafer by an adhesive material; a protection film formed on back side of the metal layer; a conductive trace formed on the dielectric layer and connected to the pads; a solder mask covered on the conductive trace and the dielectric layer to expose a portion of the conductive trace; and Under Ball Metallurgy (UBM), soldering metal formed on the exposed portion (UBM) and connected to the conductive trace.

In another embodiment, the present invention discloses a wafer level package which is comprises a wafer having a plurality of dice formed thereon, wherein the wafer has a trench formed therein; a thicker substrate with a groove on scribe line formed therein attached on the wafer by an adhesive material (the groove on scribe line can be formed after attachment on the wafer); a protection film formed on back side of the substrate and filled into the trench; a dielectric layer formed over the plurality of dice and refilled into the trench on wafer to expose pads of the plurality of dice; a conductive trace formed on the dielectric layer and connected to the pads; a solder mask covered on the conductive trace and the dielectric layer to expose a portion of the conductive trace; and UBM, soldering metal formed on the exposed portion (UBM) and connected to the conductive trace.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims. Then, the components of the different elements are not shown to scale. Some dimensions of the related components are exaggerated and meaningless portions are not drawn to provide clearer description and comprehension of the present invention.

Figure 1:
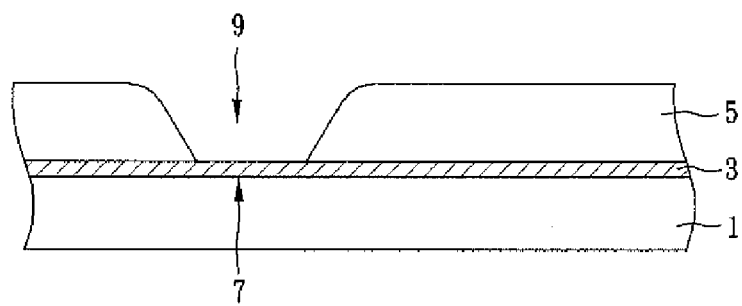
FIG. 1 is a schematic diagram of a metal layer attached on a wafer by an adhesive material according to the present invention.

The present invention discloses a novel method of forming a wafer level package and the structure of the wafer level package. The detailed description is described as follows. The description and the drawing illustrate the embodiment of the present invention, but the present invention is not limited by the embodiment. Firstly, a processed wafer backside (or first side) is initially polished or ground by a grinder or the like. Preferably, the thickness of the processed wafer having a plurality of dice is lapped to desired thickness, such as about 2-6 mil. Subsequently, an adhesive material layer 3 is formed on back-site of the wafer 5 or a substrate 1. For example, the forming method of the adhesive material layer 3 is employed by a printing or coating method. The adhesive material comprises epoxy resin, sealing glue, water soluble UV glue, re-workable UV glue, silicone resin, silicone rubber, elastic PU, (polyurethane), porous PU (polyurethane), acrylic rubber, blue tape or UV tape. In preferred embodiment, material of the substrate 1 comprises metal, such as alloy 42 (combination of 42% Ni, 58% Fe). Next, bonding the processed wafer 5 and alloy 42 substrate 1 by using any suitable material 3 that includes but not limited to an adhesive material is performed, as illustrated in FIG. 1, and then curing such structure. The alloy 42 substrate 1 can be attached by using a laminating or bonding process disclosed by prior art or the like. Preferably, the thickness of the alloy 42 substrate 1 is approximately 2-4 mil. But the actual thickness of the alloy 42 substrate 1 depends on the other parameters of the process. Quartz or ceramic can replace the alloy 42 substrate 1. The selected material used in the laminating process has a coefficient of thermal expansion (CTE) that is close to the one of the silicon. Typically, the CTE of the silicon is about 3. The main properties of the Alloy 42 comprises CTE about 4.0~4.7 (ppm/° C.), thermal conductivity about 12 (W/m-° C.), electrical resistivity about 70 ($\mu\Omega$-cm) and Yield bend fatigue strength about 620 (MPa). Special alloys like Alloy 42 have gained wide acceptance because of their thermal expansion coefficients, which closely match those of ceramics, and their high formability. As above-mentioned, the coefficients of thermal expansion of both these materials match well with those of silicon which are 2.3 ppm/° C., and that of ceramics substrate (3.4 to 7.4 ppm/° C.). Alloy 42 has a high fatigue strength of 620 MPa compared with only 380-550 MPa for most cooper alloys. The substrate material may be electrically conductive to serve as the electrical path for the signals. Moreover, the material should be resistant to corrosion, which increases the electrical resistance of the material, and thereby causing electrical failure and can eventually result in mechanical fracture. The materials in the present invention may comprise Fe—Ni alloy, Fe—Ni—Co alloy, Cu—Fe alloy, Cu—Cr alloy, Cu—Ni—Si alloy or Cu—Sn alloy etc.

Then, a photo-resist (PR) layer is coated on the processed wafer 5 surface site and exposing the photo-resist layer above a scribe line 7. The wafer (or silicon) 5 is etched by using a photo-resist mask (not shown) having a specific pattern after a developing process of the photo-resist to separate the chips. Preferably, the openings of the photo-resist mask are aligned to the scribe line 7 formed on the surface of the wafer 5, thereby exposing the scribe line. In a preferred embodiment, the silicon wafer 5 is etched by using wet etch such that a trench 9 generated by the step having a slope profile. As known in the art, the above result can be easily obtained by controlling the recipe of the etching. The above two steps can be replaced by dicing saw mechanical process.

Figure 2:
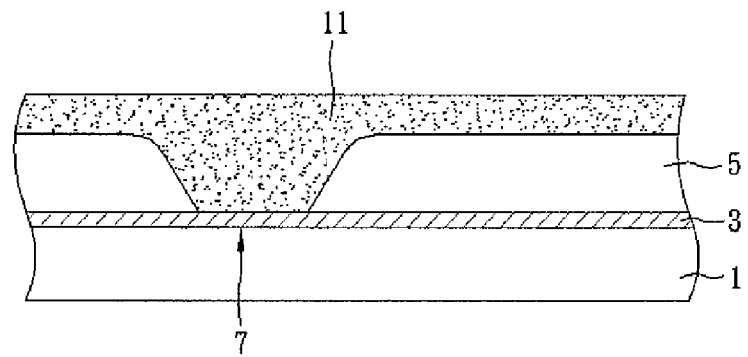
FIG. 2 is a schematic diagram of a dielectric layer formed over plurality of dice and refilled into a trench according to the present invention.

Turning to FIG. 2, a dielectric layer 11, which may be, for example, a material such as BCB, SINR (Siloxanes polymer), epoxy, polyimides, silicone rubber based or resin is then formed on the second side (top) of the wafer 5 and filled into the scribe line 7, and that is preferably done by means of printing, vacuum coating process. The step is similar to the formation of the tape as typical used. The vacuum coating dielectric layer process prevents the formation of bubbles in the dielectric layer 11, and the dielectric layer 11 will refill into the trench 9 automatically. Then, a curing step is performed by using the ultraviolet (UV) radiation to harden the dielectric layer 11. Alternatively, a thermal process may be used to cure the material. A Chemical mechanical polishing (CMP) process is optional used to grind the dielectric layer 11 on the wafer circuit side.

Figure 3:
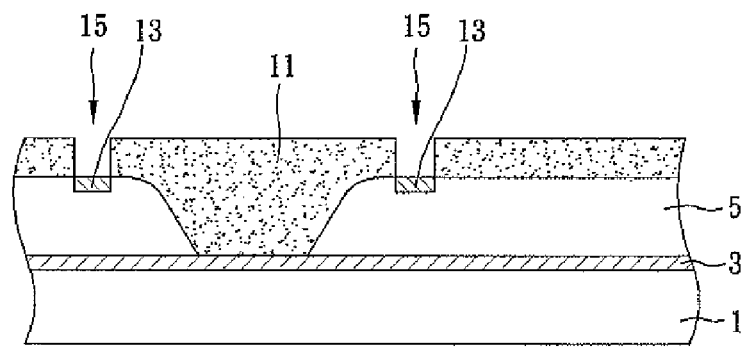
FIG. 3 is a schematic diagram of a dielectric layer formed over plurality of dice to expose pads of the plurality of dice according to the present invention.

Next, a photo-resist (PR) layer is coated on the dielectric layer 11 surface site and then exposing the photo-resist layer above Al bonding pads 13 by employing a photolithography process. An etching process is performed to remove partial dielectric layer 11 to create an opening to expose the Al bonding pads 13, and thereby a plurality of openings 15 are formed in the dielectric layer 11 and aligned to the pads 13 of the dice (chips), as illustrated in FIG. 3. The other method to open the Al pads is using the photolithography process once the dielectric layer 11 is the photo sensitive materials. Consequently, the pads 13 on the chip are exposed. Plasma etching is performed to clean the Al bonding pads 13. It should be noted that the alignment mark is visible to the alignment tool for subsequent alignment. Further, the dielectric layer 11 exhibits the characteristic of moisture resistant.

Figure 4:
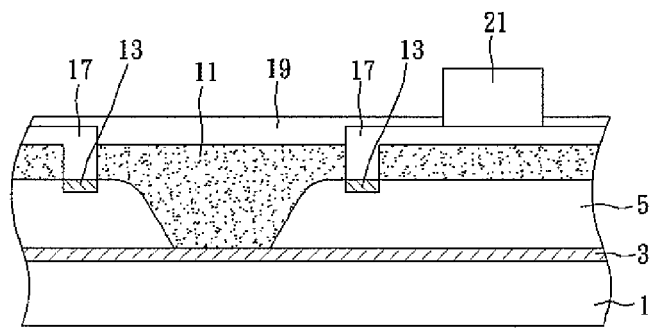
FIG. 4 is a schematic diagram of a solder mask covered on the conductive trace and solder balls formed on the exposed portion of the conductive trace according to the present invention.

Subsequently, a conductive trace layout or so-called pad circuit re-distribution is arranged over the upper surface of the dielectric layer 11, as illustrated in FIG. 4. The re-distribution conductive trace 17 can be composed of any conductive layer such as metal, alloy or the like. In general process, a barrier seed layer is formed within the opening 15 and over the bonding pads 13, for example the seed layer is sputtered by using source material of Ti/Cu or Ti/W/Cu alloy etc. A photo-resist is coated on top of the seed layer, and then photo mask defines the RDL conductive layer pattern. The RDL trace is formed on the seed layer, for example by employing an electro-plating method by using source material of Cu/Au or Cu/Ni/Au alloy etc. Photo-resist is then stripped and metal wet etching is proceeded to form the RDL metal trace. In order to provide for proper placement and pitch of the solder bumps that are to be introduced at a later stage, the redistributed layer (RDL) could be redistributed to form on the barrier layer As known by the arts, portion of the re-distribution conductive trace 17 contacts to the pads 13 for electrically connection.

Still turning to FIG. 4, a solder mask dielectric layer 19 (top protection layer) is deposited to cover the dielectric layer 11 and the RDL conductive trace 17 for isolation to protect the RDL conductive trace 17. The dielectric layer 19 may be formed by printing or coating, and then employing a photolithography process to form a photo mask to define the solder pads. A photolithography process is proceeded to remove partial the dielectric layer 19 to create a second opening to expose the redistributed layer trace to form solder pads. Next, plasma clean the solder pads may be made. The above processes for forming RDL trace 17 can be repeated to form the multi-layers metal re-distribution UBM structure. In this approach, the shape of the UBM is defined primarily by the patterned dielectric layer 19, and a photo definable epoxy is optionally coated onto a wafer to serve as a Stress Compensation Layer (SCL).

Figure 5:
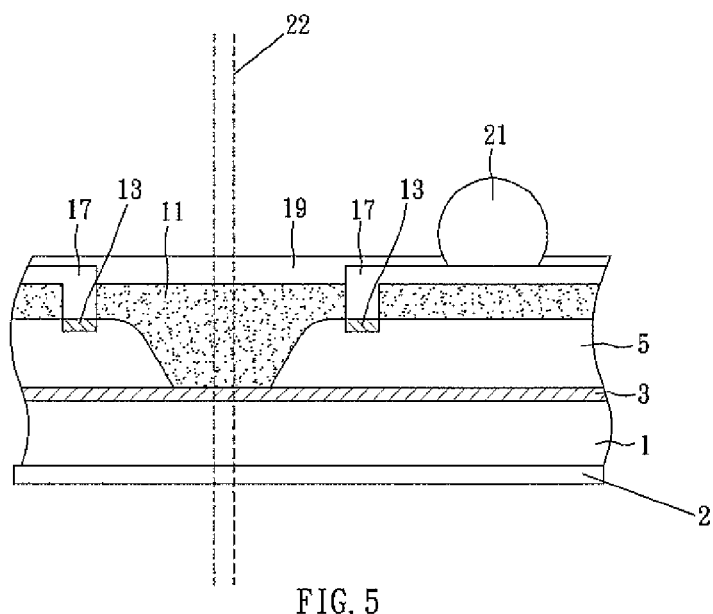
FIG. 5 is a schematic diagram of a protection film formed on back side of the metal cover layer according to the present invention.
Figure 6:
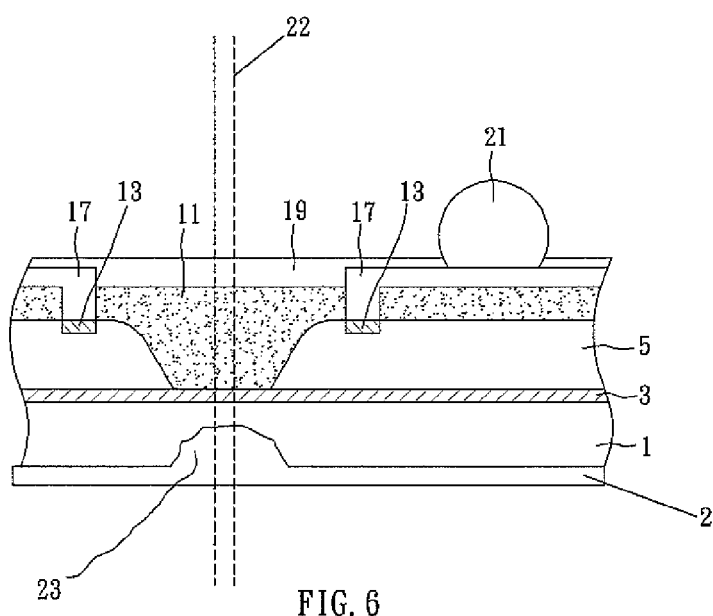
FIG. 6 is a schematic diagram of a protection film formed on back side of the metal cover layer according to the present invention.

The solder mask 19 exposes a desired portion of the RDL conductive trace 17, and the exposed area of the RDL conductive trace 17 is pre-determined to locate solder balls as an electrically connecting terminal. A solder paste printing process is carried out to print solder 21 on the pre-determined area, and the solder 21 contacts to the RDL conductive trace 17 (through UBM; UBM portion not shown in drawing). Then, the solder 21 is employed by an IR re-flow at a temperature as known in the art to obtain a spherical shape as a terminal contactor, as shown in FIG. 5. The semiconductor die 5 is coupled to solder ball 21 by pad circuit or conductive traces 17. The solder ball 21 can be formed by typical ball grid array (BGA) technique. Preferably, the solder balls 21 are configured in a matrix form. Typically, the solder balls 21 are connected with the circuit so as to establish an electrical connection.

Subsequently, the wafer is set to a testing apparatus for wafer level testing and/or burn-in test. A sawing process is next performed after the wafer-level-package (WLP) test to separate the dice by cutting the scribe line 22, thereby obtaining the chip scale package (CSP). In a package structure with thinner thickness substrate 1, it proceeds to print the protection film 2, which may be made of epoxy resin, compound, dielectric layer, silicone, silicone rubber, silicone resin, elastic PU (polyurethane), porous PU (polyurethane), acrylic rubber, blue tape or UV tape materials, on the back-site of the alloy 42 substrate 1 to form the cover layer of the package, shown in FIG. 5, which is facilitated for laser marking and obtaining a better sawing quality. For example, thickness of the metal layer 1 is about from 2.0 mil to 4.0 mil. The protection film 2 is capable of marking by laser or ink. In preferred embodiment, material of the protection film 2 comprises resin, compound, dielectric layer, silicone, blue tape, UV tape, silicone rubber, silicone resin, elastic PU (polyurethane), porous PU (polyurethane) or acrylic rubber. Finally, dicing (laser) saw is facilitated to cut the processed wafer with alloy 42 substrate 1 along the scribe line 22 to separate the package.

Moreover, in another preferred embodiment, which includes a package structure with thicker thickness substrate 1, photo-resist is coated on the back-site of the alloy 42 substrate 1 and then exposing the photo-resist on the scribe line 22, and thereby forming a pre-determined pattern on the substrate 1 and an opening formed the pre-determined pattern there-between and on the scribe line. Next, a wet etching process is performed to the thinner thickness of alloy 42 substrate 1 on the scribe line 22 to form a groove 23 thereon to facilitate for dicing and thereby creating a better sawing quality. And then, it proceeds to form the protection film 2, for example made of resin, compound, dielectric layer, silicone, silicone rubber, silicone resin, elastic PU (polyurethane), porous PU (polyurethane), acrylic rubber, blue tape or UV tape materials, on the back-site of the alloy 42 substrate 1 by printing, coating, tapping or molding method and filled into the groove 23 to form the cover layer of the package. For example, depth of the groove 23 is about from 2.0 mil to 10.0 mil. In this embodiment, the thicker substrate 1 on the scribe line area is etched to be a thinner layer like the preceding embodiment and the groove 23 is filled into the cover material so that such structure is also facilitated for laser marking and obtaining a better sawing quality of the package. Similarly, dicing (laser) saw is cut the processed wafer along the scribe line 22 to separate the package.

In conclusion, the structure and process of the present invention have some advantages which include the followings: protective the silicon chip without damage, non fragile materials, better thermal conductivity, using alloy 42 CTE (~4.1) close to the silicon substrate (2.6), fully packaging the chip, thinner package possible and multi-layers RDL conductive layer. Therefore, the structure and process for WL-CSP with Metal cover of the present invention can improve the packaging performance and life cycle during reliability testing.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

Having described the invention, the following is claimed:

1. A wafer level package, comprising:
   a wafer having a plurality of dice formed thereon, wherein said wafer has a trench formed therein, and said wafer is attached on a metal cover layer by an adhesive material;
   a dielectric layer formed over said plurality of dice and refilled into said trench to expose pads of said plurality of dice;
   a protection film formed on back side of said metal cover layer;
   a conductive trace formed on said dielectric layer and connected to said pads;
   a solder mask covered on said conductive trace and said dielectric layer to expose a portion of said conductive trace; and
   solder balls formed on said exposed portion and connected to said conductive trace.

2. The package in claim 1, wherein material of said dielectric layer comprises BCB (Benzocyclobutene), SINR (Siloxanes polymer), epoxy, silicone rubber based, polyimides or resin.

3. The package in claim 1, wherein said adhesive material comprises epoxy, sealing glue, water soluble UV (ultraviolet) glue, reworkable UV (ultraviolet) glue, silicone resin, silicone rubber, elastic PU (polyurethane), porous PU (polyurethane), acrylic rubber, blue tape or UV (ultraviolet) tape.

4. The package in claim 1, wherein said metal cover layer comprises alloy 42 (42% Ni, 58% Fe).

5. The package in claim 1, wherein material of said protection film comprises epoxy resin, compound, dielectric layer, silicone, blue tape, UV (ultraviolet) tape, silicone rubber, silicone resin, elastic PU (polyurethane), porous PU (polyurethane) or acrylic rubber 6. The package in claim 1, wherein said protection film is capable of marking by laser or ink.

7. The package in claim 1, wherein said solder mask comprises a second dielectric layer.

8. The package in claim 7, wherein material of said second dielectric layer comprises BCB (Benzocvclobutene), SINR (Siloxanes polymer), epoxy, silicone rubber based, polyimides or resin.

9. The package in claim 1, wherein thickness of said metal layer is about from 2.0 mil to 4.0 mil.

10. A wafer level package, comprising:
a wafer having a plurality of dice formed thereon, wherein said wafer has a trench formed therein;
a substrate with a groove formed therein attached on said wafer by an adhesive material;
a protection film formed on back side of said substrate and filled into said groove;
a dielectric layer formed over said plurality of dice and refilled into said trench to expose pads of said plurality of dice;
a conductive trace formed on said dielectric layer and connected to said pads;
a solder mask covered on said conductive trace and said dielectric layer to expose a portion of said conductive trace; and
solder balls formed on said exposed portion and connected to said conductive trace.

11. The package in claim 10, wherein material of said dielectric layer comprises BCB (Benzocvelobutene), STNR (Siloxanes polymer), epoxy, silicone rubber based, polyimides or resin.

12. The package in claim 10, wherein said adhesive material comprises epoxy, sealing glue, water soluble UV (ultraviolet) glue, reworkable UV (ultraviolet) glue, silicone resin, elastic PU (polyurethane), porous PU (polyurethane), acrylic rubber, blue tape or UV tape.

13. The package in claim 10, wherein said substrate comprises metal.

14. The package in claim 10, wherein said substrate comprises alloy 42 (42% Ni, 58% Fe).

15. The package in claim 10, wherein material of said protection film comprises epoxy resin, compound, dielectric layer, silicone, blue tape, UV (ultraviolet) tape, silicone rubber, silicone resin, elastic PU (polyurethane), porous PU (polyurethane) or acrylic rubber.

16. The package in claim 10, wherein said protection film is capable of marking by laser or ink.

17. The package in claim 10, wherein said solder mask comprises a second dielectric layer.

18. The package in claim 17, wherein material of said second dielectric layer comprises BCB (Beuzocyclobutene), SINR (Siloxanes polymer), epoxy, silicone rubber based, polyimides or resin.

19. The package in claim 10, wherein depth of said groove is about from 2.0 mil to 10.0 mil.

* * * * *